United States Patent
Lee et al.

(10) Patent No.: US 9,609,786 B2
(45) Date of Patent: Mar. 28, 2017

(54) COOLING SYSTEM FOR AN ELECTRONIC RACK

(71) Applicant: Academia Sinica, Taipei (TW)

(72) Inventors: Shih-Chang Lee, Taipei (TW); Ming-Lee Chu, Taipei (TW); Chih-Hsun Lin, Taipei (TW)

(73) Assignee: ACADEMIA SINICA, Taipei (TW)

( * ) Notice: Subject to any disclaimer, the term of this patent is extended or adjusted under 35 U.S.C. 154(b) by 185 days.

(21) Appl. No.: 14/468,869

(22) Filed: Aug. 26, 2014

(65) Prior Publication Data
US 2014/0362531 A1   Dec. 11, 2014

Related U.S. Application Data

(63) Continuation-in-part of application No. 13/371,497, filed on Feb. 13, 2012, now Pat. No. 8,879,268.

(30) Foreign Application Priority Data

Apr. 1, 2011 (TW) .............................. 100205840 U

(51) Int. Cl.
H05K 7/20 (2006.01)

(52) U.S. Cl.
CPC ....... *H05K 7/2039* (2013.01); *H05K 7/20409* (2013.01); *H05K 7/20445* (2013.01); *H05K 7/20545* (2013.01); *H05K 7/20709* (2013.01)

(58) Field of Classification Search
CPC .......... H05K 7/20709; H05K 7/20445; H05K 7/2039; H05K 7/20409; H05K 7/20545

USPC ................. 361/704, 707, 714–716, 724–727
See application file for complete search history.

(56) References Cited

U.S. PATENT DOCUMENTS

| 3,971,186 A | * | 7/1976 | Havelka | F16B 2/14 403/374.4 |
| 3,975,805 A | * | 8/1976 | Spurling | F16B 2/18 211/41.17 |
| 4,994,937 A | * | 2/1991 | Morrison | H05K 7/1409 174/16.3 |
| 5,071,013 A | * | 12/1991 | Peterson | H05K 7/1404 211/26 |
| 5,290,122 A | * | 3/1994 | Hulme | H05K 7/1404 165/80.2 |
| 5,812,375 A | * | 9/1998 | Casperson | H05K 1/0204 165/80.3 |
| 6,026,565 A | * | 2/2000 | Giannatto | H05K 7/1424 165/104.33 |

(Continued)

*Primary Examiner* — Anatoly Vortman
(74) *Attorney, Agent, or Firm* — Bacon & Thomas, PLLC

(57) ABSTRACT

The present invention discloses a cooling system for an electronic rack, comprising: an electronic rack comprising at least one side wall; at least one electronic chassis comprising a top wall and at least one side wall and disposed inside the electronic rack for housing at least one modular electronics equipment comprising a plurality of electronic components and at least one stationary thermal interface arranged above the plurality of electronic components; a first detachable thermal interface arranged between the top wall of the at least one electronic chassis and the at least one modular electronic equipment; and at least one second detachable thermal interface arranged between the at least one side wall of the electronic rack and the at least one side wall of the at least one electronic chassis.

12 Claims, 10 Drawing Sheets

(56) References Cited

U.S. PATENT DOCUMENTS

| | | | | |
|---|---|---|---|---|
| 6,180,436 B1* | 1/2001 | Koors | H01L 23/3675 | 257/E23.104 |
| 6,657,121 B2* | 12/2003 | Garner | H05K 7/20681 | 174/16.3 |
| 6,693,797 B2* | 2/2004 | Faneuf | H05K 7/20809 | 165/104.33 |
| 6,798,661 B1* | 9/2004 | Barsun | H01L 23/467 | 165/80.4 |
| 7,403,384 B2* | 7/2008 | Pflueger | H05K 7/20545 | 165/104.21 |
| 7,643,309 B1* | 1/2010 | Lebo | H05K 5/06 | 174/520 |
| 8,000,103 B2* | 8/2011 | Lipp | F28D 1/05316 | 165/104.33 |
| 8,045,332 B2* | 10/2011 | Lee | H05K 7/1404 | 361/756 |
| 8,289,710 B2* | 10/2012 | Spearing | H05K 7/20727 | 174/50 |
| 8,427,828 B2* | 4/2013 | Kehret | G06F 1/183 | 165/104.33 |
| 8,477,498 B2* | 7/2013 | Porreca | H05K 7/1404 | 361/696 |
| 8,526,184 B2* | 9/2013 | Sullivan | H05K 7/1404 | 165/80.2 |
| 2003/0000721 A1* | 1/2003 | Garner | H05K 7/20681 | 174/50 |
| 2003/0051860 A1* | 3/2003 | Montgomery | F28D 15/043 | 165/46 |
| 2003/0201902 A1* | 10/2003 | Post | G06F 13/409 | 340/693.5 |
| 2003/0223197 A1* | 12/2003 | Hulan | H05K 7/20545 | 361/719 |
| 2004/0037045 A1* | 2/2004 | Phillips | F28D 15/0266 | 361/719 |
| 2005/0013117 A1* | 1/2005 | Barsun | H01L 23/467 | 361/700 |
| 2007/0034360 A1* | 2/2007 | Hall | G06F 1/183 | 165/104.33 |
| 2008/0084668 A1* | 4/2008 | Campbell | H01L 23/473 | 361/702 |
| 2008/0164008 A1* | 7/2008 | Austin | H05K 7/1404 | 165/80.2 |
| 2008/0259566 A1* | 10/2008 | Fried | F28D 15/0266 | 361/699 |
| 2009/0159241 A1* | 6/2009 | Lipp | F28D 1/05316 | 165/80.2 |
| 2010/0020514 A1* | 1/2010 | Lee | H05K 7/1404 | 361/801 |
| 2011/0013359 A1* | 1/2011 | Goldrian | G06F 1/20 | 361/679.54 |
| 2011/0058335 A1* | 3/2011 | Sullivan | H05K 7/1404 | 361/704 |
| 2011/0187188 A1* | 8/2011 | Yang | H02M 7/04 | 307/31 |
| 2011/0267776 A1* | 11/2011 | Porreca | H05K 7/20545 | 361/694 |
| 2012/0020017 A1* | 1/2012 | Kehret | G06F 1/183 | 361/679.54 |
| 2013/0077232 A1* | 3/2013 | Nordin | H05K 7/20809 | 361/679.47 |

* cited by examiner

COOLING SYSTEM FOR AN ELECTRONIC RACK

CROSS REFERENCE TO RELATED APPLICATIONS

This application is a continuation-in-part of prior application Ser. No. 13/371,497, filed Feb. 13, 2012, which claims the benefit of Taiwan Application No. 100205840, filed Apr. 1, 2011.

BACKGROUND OF THE INVENTION

Field of the Invention

The present invention relates to a cooling system, and more particularly, to a cooling system for an electronic rack.

Description of the Prior Art

FIG. 1 illustrates the thermal paths of a conventional cooling system 100 for an electronics rack, and the arrows denote the heat flows. Heat generated by heat sources 110 (electronic components equipped in the electronic equipment, e.g. IC or hard disk) is removed to the external environment 112 by the forced air circulation 111. Air is used as heat transfer media. For facilities like data centers, which house a lot of computer racks and associated components, an active cooling system 113 is needed in order to lower the temperature and increase the heat transfer capability of the circulated air. However, it is difficult to bring cold air into equipment effectively without fans and additional infrastructures.

An electronic rack can be filled easily by equipment with total power more 20 kilo-Watt today. The cooling infrastructure for such system requires very high air flow rate. It will take more area and power than electronic equipment. A good example is the energy efficiency of a data center. The common way to determine the energy efficiency of a data center is power usage effectiveness (PUE). This ratio is obtained with the total power delivered to the data center divided by the power used by equipment. The average PUE value of data centers is around 2. In other words, a data center with one Mega-Watt electronics equipment has to spend another Mega-Watt for the cooling system of the data center. Moreover, the conventional cooling system for an electronics rack is disadvantageous in that it is energy inefficient and causes enormous noises. The wear-out of moving parts of fans will also degrade the reliability of the overall system.

In view of the aforementioned disadvantages, the present invention provides a cooling system for an electronic rack characterized by no fans, low noises and low power consumption.

SUMMARY OF THE INVENTION

One object of the present invention is to provide a cooling system for an electronic rack characterized by no fans, low noises and low power consumption.

To achieve the aforementioned object, the present invention provides a cooling system for an electronic rack comprising: an electronic rack comprising at least one side wall; at least one electronic chassis comprising a top wall and at least one side wall and disposed inside the electronic rack for housing at least one modular electronic equipment comprising a plurality of electronic components and at least one stationary thermal interface arranged above the plurality of electronic components; a first detachable thermal interface arranged between the top wall of the at least one electronics chassis and the at least one modular electronic equipment; and at least one second detachable thermal interface arranged between the at least one side wall of the electronic rack and the at least one side wall of the at least one electronic chassis.

In the aforementioned cooling system for an electronic rack of the present invention, the first detachable thermal interface or the at least one second detachable thermal interface is made of material with high thermal conductivity.

In the aforementioned cooling system for an electronic rack of the present invention, the first detachable thermal interface or the at least one second detachable thermal interface is made of metallic material.

In the aforementioned cooling system for an electronic rack of the present invention, the first detachable thermal interface or the at least one second detachable thermal interface is a heat pipe.

In the aforementioned cooling system for an electronic rack of the present invention, the electronic rack is provided with no fans therein.

In the aforementioned cooling system for an electronic rack of the present invention, the first detachable thermal interface comprises a first contact portion, a second contact portion and a locking portion. The displacement of one of the first contact portion and the second contact portion with respect to the other is effected by actuating the locking portion.

In the aforementioned cooling system for an electronic rack of the present invention, the at least one second detachable thermal interface comprises a first contact portion, a second contact portion and a locking portion. The displacement of one of the first contact portion and the second contact portion with respect to the other is effected by actuating the locking portion.

To achieve the aforementioned object, the present invention provides another cooling system for an electronic rack comprising: an electronic rack comprising at least one side wall; at least one modular electronic equipment comprising a top wall, at least one side wall, a plurality of electronic components and at least one stationary thermal interface arranged between the upper portions of the plurality of electronic components and the top wall and disposed inside the electronic rack; and at least one detachable thermal interface arranged between the at least one side wall of the electronics rack and the at least one side wall of the at least one modular electronic equipment.

In the aforementioned cooling system for an electronics rack of the present invention, the at least one detachable thermal interface is made of material with high thermal conductivity.

In the aforementioned cooling system for an electronic rack of the present invention, the first detachable thermal interface or the at least one second detachable thermal interface is made of metallic material.

In the aforementioned cooling system for an electronic rack of the present invention, the at least one detachable thermal interface is a heat pipe.

In the aforementioned cooling system for an electronic rack of the present invention, the electronic rack is provided with no fans therein.

In the aforementioned cooling system for an electronic rack of the present invention, the at least one detachable thermal interface comprises a first contact portion, a second contact portion and a locking portion. The displacement of one of the first contact portion and the second contact portion with respect to the other is effected by actuating the locking portion.

In the cooling system for an electronic rack of the present invention, heat generated by heat sources in electronic equipment is effectively dissipated to the external environment by thermal conduction. Therefore, the present cooling system requires no fans and is characterized by low noises and low power consumption. The following detailed embodiments, appended drawings and claims will enable the reader to better understand other objects, features and advantages of the present invention.

BRIEF DESCRIPTION OF THE DRAWINGS

The following drawings and description will facilitate the understanding of the system and method of the present invention. Please refer to the description on the drawings for exemplary embodiments not detailed in the specification. Constituent components may have been magnified and not illustrated according to actual scale for purposes of pictorial clarity. The same components in different drawings are denoted by the same symbols.

DETAILED DESCRIPTION OF THE PREFERRED EMBODIMENTS

Figure 1:
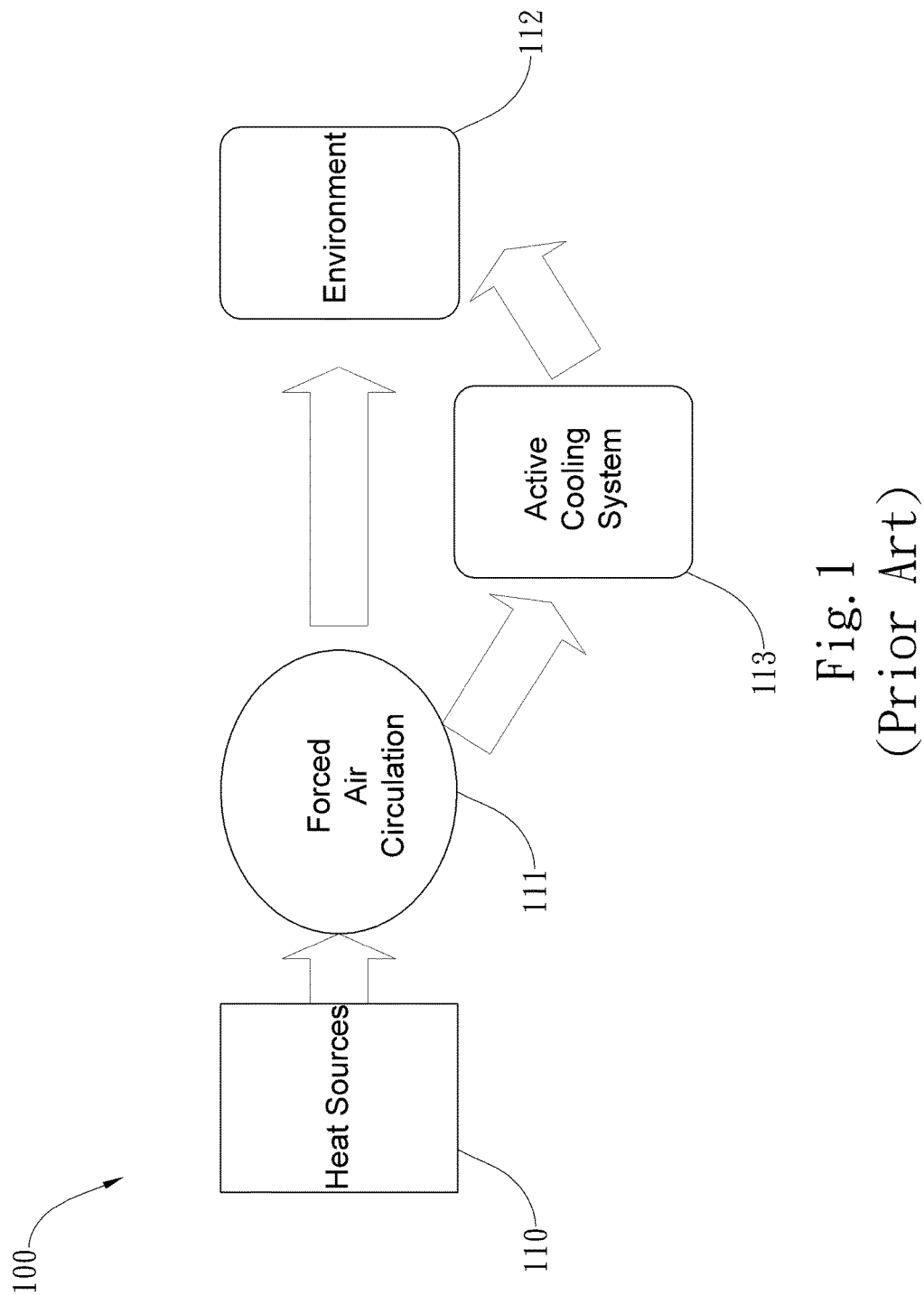
FIG. 1 is a diagram illustrating the thermal paths of a conventional cooling system 100 for an electronic rack.

The detailed embodiments of the present invention will be provided in the following paragraphs. It is to be noted that the embodiments of the present invention are exemplary. The present invention is not limited to the embodiments comprising specific features, structures or properties and the scope thereof is defined by the appended claims. In addition, the drawings do not specifically illustrate all unnecessary features of the present invention. For those illustrated in the drawings, they may be represented in simplified form or schematic manner. Furthermore, for the sake of clarity, the sizes of the components may be magnified in the drawings or not in actual proportion. Whether or not the components are simplified in form or the features are illustrated in detail, they fall within the scope of knowledge of the art so that they can be implemented by those skilled in the art in view of other embodiments related to the features, structures or properties.

Figure 2:
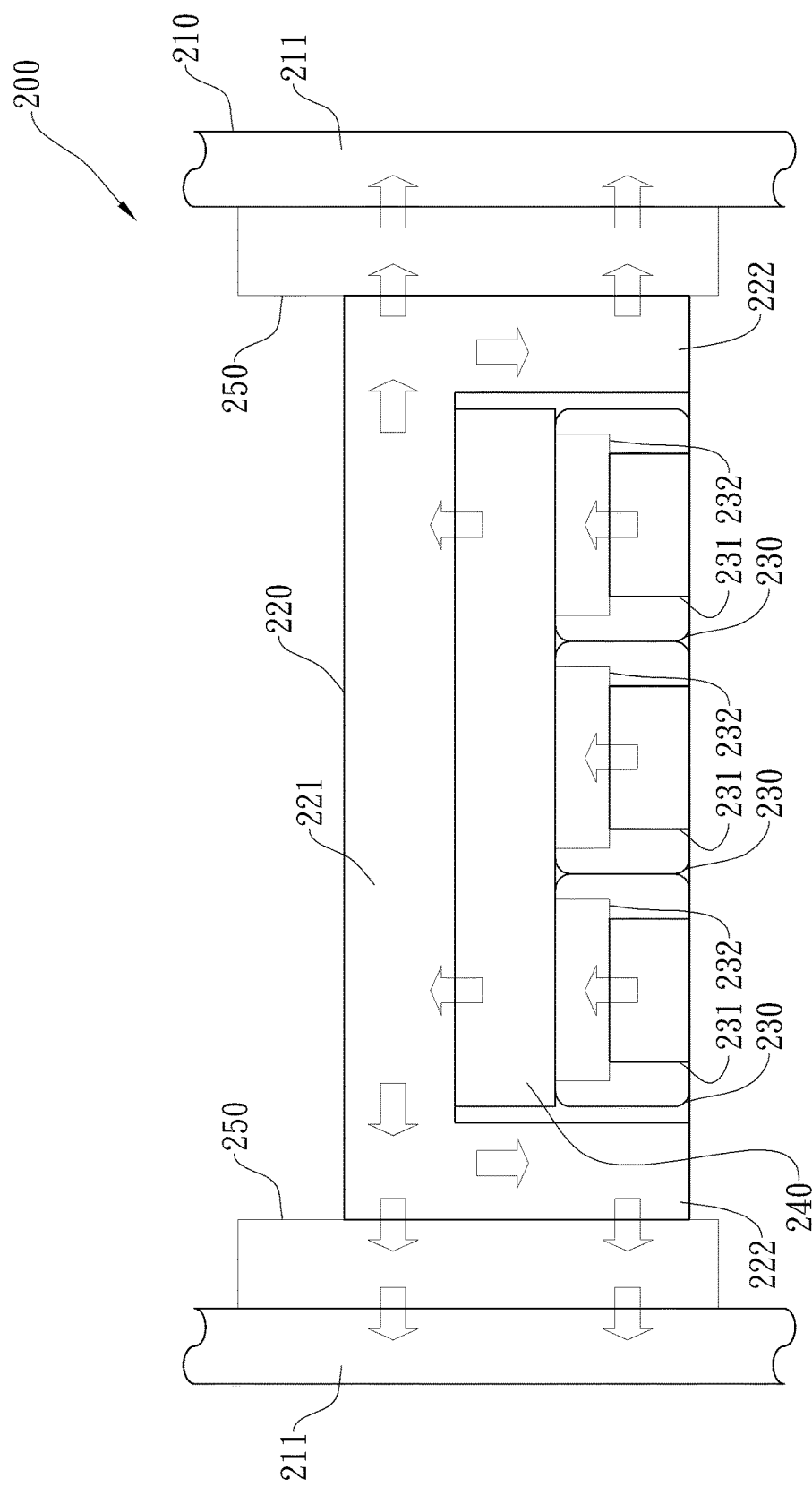
FIG. 2 is a partial view of a cooling system for an electronic rack in accordance with the first embodiment of the present invention.

FIG. 2 is a partial view of a cooling system for an electronic rack in accordance with the first embodiment of the present invention. The cooling system 200 for an electronic rack of the present invention comprises an electronic rack 210, a plurality of electronic chassis 220, a plurality of modular electronic equipment 230, a first detachable thermal interface 240 and a plurality of second detachable thermal interfaces 250. As the plurality of electronics chassis 220 of the cooling system 200 for an electronic rack are connected to the electronic rack 210 in the same manner, FIG. 2 only shows one electronic chassis 220. The electronic rack 210 comprises two side walls 211. The electronic chassis 220 comprises a top wall 221 and two side walls 222 and is disposed inside the electronics rack 210 for housing the plurality of modular electronics equipment 230. Each of the plurality of modular electronic equipment 230 comprises a plurality of electronic components 231 (e.g. IC, hard disk, etc.) and a stationary thermal interface 232 disposed above the plurality of electronic components 231. The first detachable thermal interface 240 is arranged between the top wall 221 of the electronic chassis 220 and the plurality of modular electronic equipment 230. The plurality of second detachable thermal interfaces 250 are arranged between the side walls 211 of the electronic rack 210 and the side walls 222 of the electronic chassis 220. The arrows in FIG. 2 indicate the heat flows, i.e. the thermal paths, in the cooling system 200 for an electronic rack. Heat generated by the electronic components 231 (e.g. IC, hard disk, etc.) in the plurality of electronic equipment 230 is conducted to the top wall 221 and the two side walls 222 of the electronic chassis 220 via the stationary thermal interface 232 and the first detachable thermal interface 240. The two side walls 211 of the electronic rack 210 then conduct the heat generated by the electronic components 231 in the plurality of electronic equipment 230 to the external environment from the top wall 221 and the two side walls 222 of the electronic chassis 220 via the plurality of second detachable thermal interfaces 250. The arrangement of thermal interfaces and large contact surfaces enables the cooling system 200 for an electronic rack to conduct and dissipate heat effectively without fans and air flows. In one embodiment of the present invention, the first detachable thermal interface 240 and the plurality of second detachable thermal interfaces 250 can be plates made by material with high thermal conductivity, heat pipes, or metallic plates. The configuration of the detachable thermal interface 240, 250 and the plurality of electronic components 231 in each modular electronics equipment 230 may be different, as the four alternative embodiments in FIGS. 3, 4, 5, and 6 show.

Figure 3A:
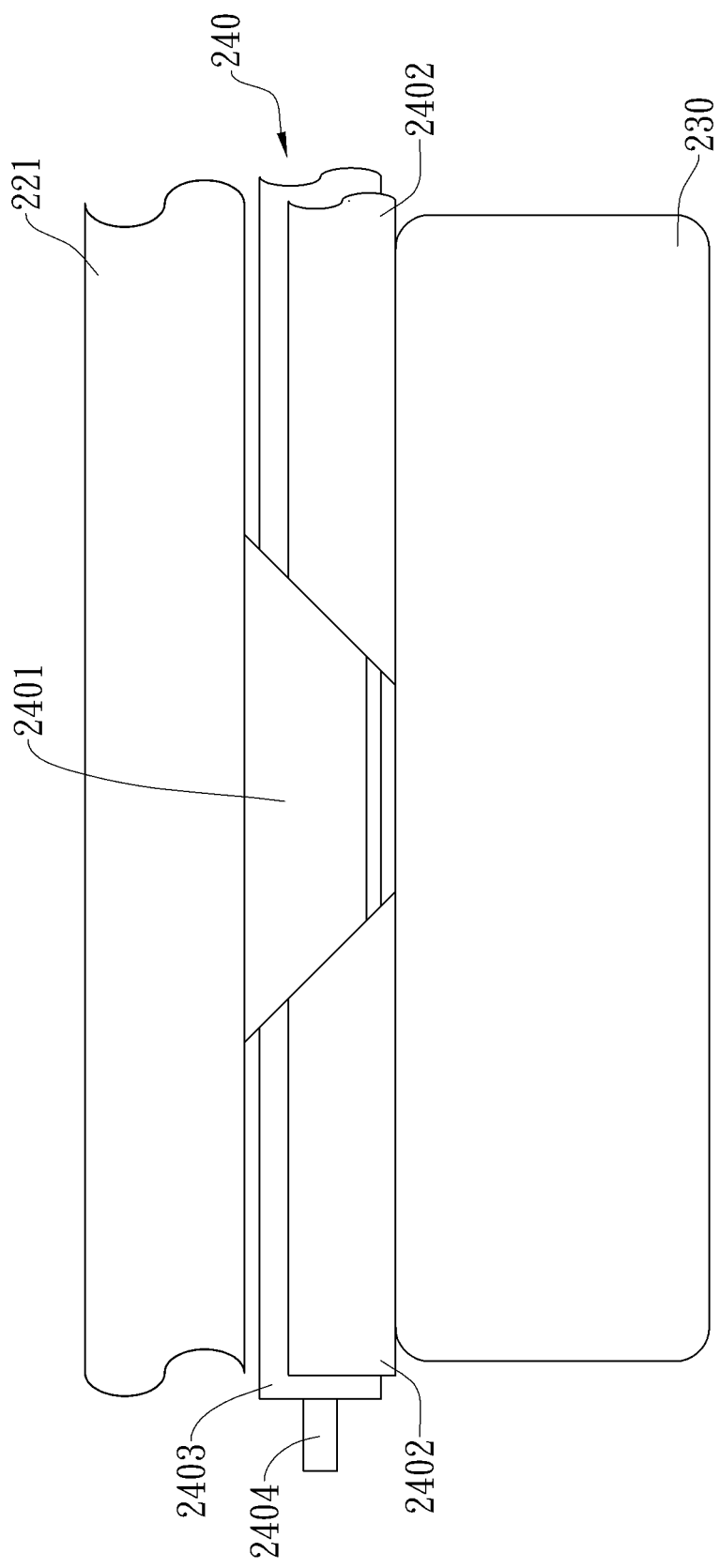
FIG. 3A is an enlarged view illustrating the modular electronic equipment, the first detachable thermal interface in the locked state and the top wall of the electronic chassis shown in FIG. 2 in accordance with the first embodiment of the present invention.
Figure 3B:
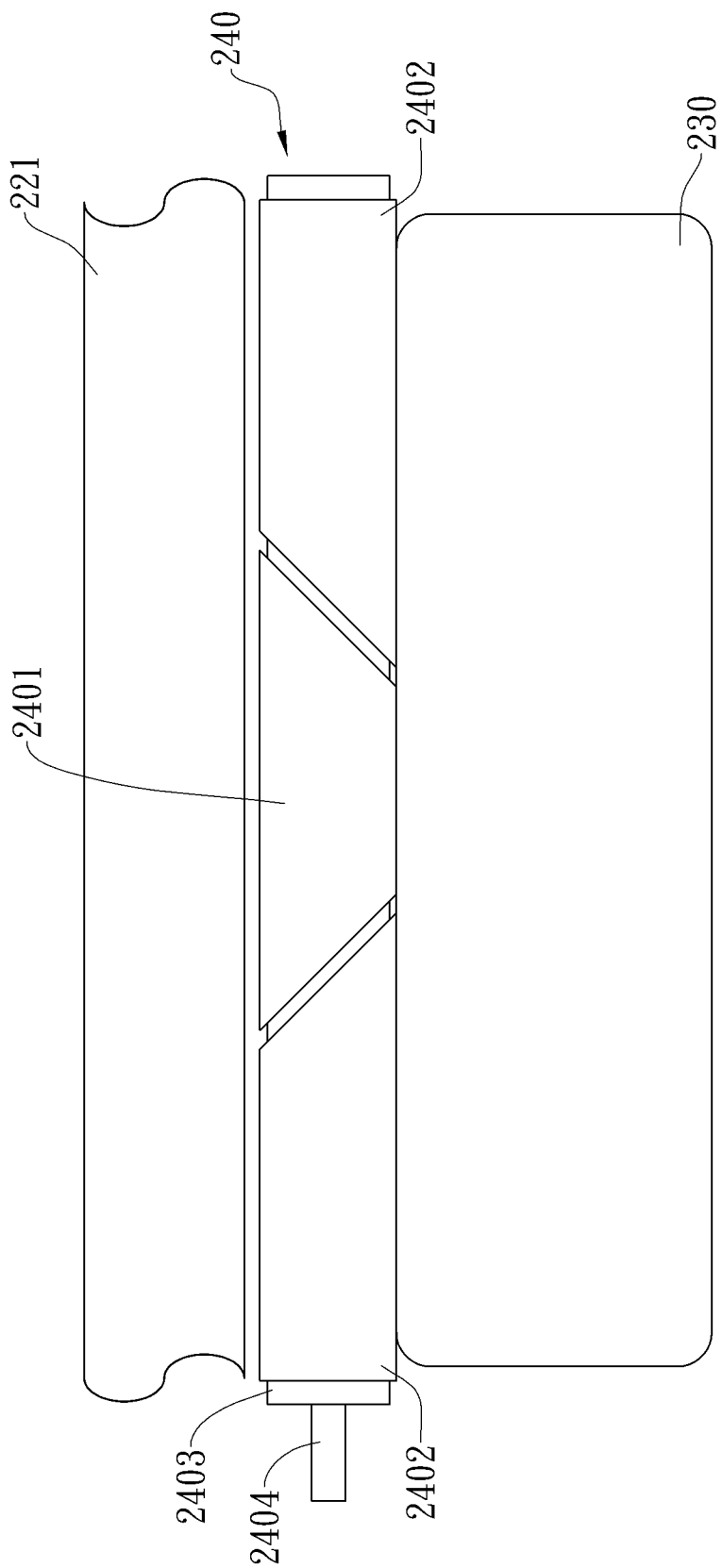
FIG. 3B is an enlarged view illustrating the modular electronic equipment, the first detachable thermal interface in the detached state, and the top wall of the electronic chassis shown in FIG. 2 in accordance with the first embodiment of the present invention.

It is important that the modular electronic equipment or the electronic chassis is removable. Therefore, the structural design of the detachable thermal interface of the present invention enables the modular electronic equipment or the electronic chassis to be removed for replacement easily. FIGS. 3A and 3B are enlarged views illustrating the modular electronic equipment 230, the first detachable thermal interface 240 and the top wall 221 of the electronic chassis 220 shown in FIG. 2. Moreover, FIGS. 3A and 3B illustrate the first detachable thermal interface 240 in the locked state and the detached state, respectively. The first detachable thermal interface 240 comprises a first contact portion 2401, two second contact portions 2402, a main body 2403 and a locking portion 2404. The first contact portion 2401 and the second contact portion 2402 are wedge plates movably disposed on the main body 2403. FIG. 3A is a diagram illustrating the first detachable thermal interface 240 in the locked state. The fastening of the locking portion 2404 to the interior of the main body 2403 causes the second contact portions 2402 to move toward each other so as to push the first contact portion 2401 in the Z direction (i.e. a direction toward the top wall 221 of the electronics chassis 220). Consequently, the first contact portion 2401 is in close contact with the top wall 221 of the electronics chassis 220. Please also refer to FIG. 2. Heat generated by electronic components 231 (e.g. IC, hard disk, etc.) in the modular electronic equipment 230 can be conducted to the top wall 221 and the two side walls 222 of the electronics chassis 220 via the stationary thermal interfaces 232 and the first detachable thermal interface 240. FIG. 3B is a diagram illustrating the first detachable thermal interface 240 in the detached state. The detachment of the locking portion 2404 from the main body 2403 causes the separation of the second contact portions 2402. Consequently, the force that pushes the first contact portion 2401 in the Z direction (i.e. a direction toward the top wall 221 of the electronics chassis 220) disappears, and the first contact portion 2401 ceases to be in contact with the top wall 221 of the electronics chassis 220. Therefore, the modular electronic equipment 230 can be removed for replacement easily. Similarly, the structural design of the first detachable thermal interface 240 can be applied to the second detachable thermal interface 250 arranged between the side wall 211 of the electronics rack 210 and the side wall 222 of the electronic chassis 220.

Figure 4A:
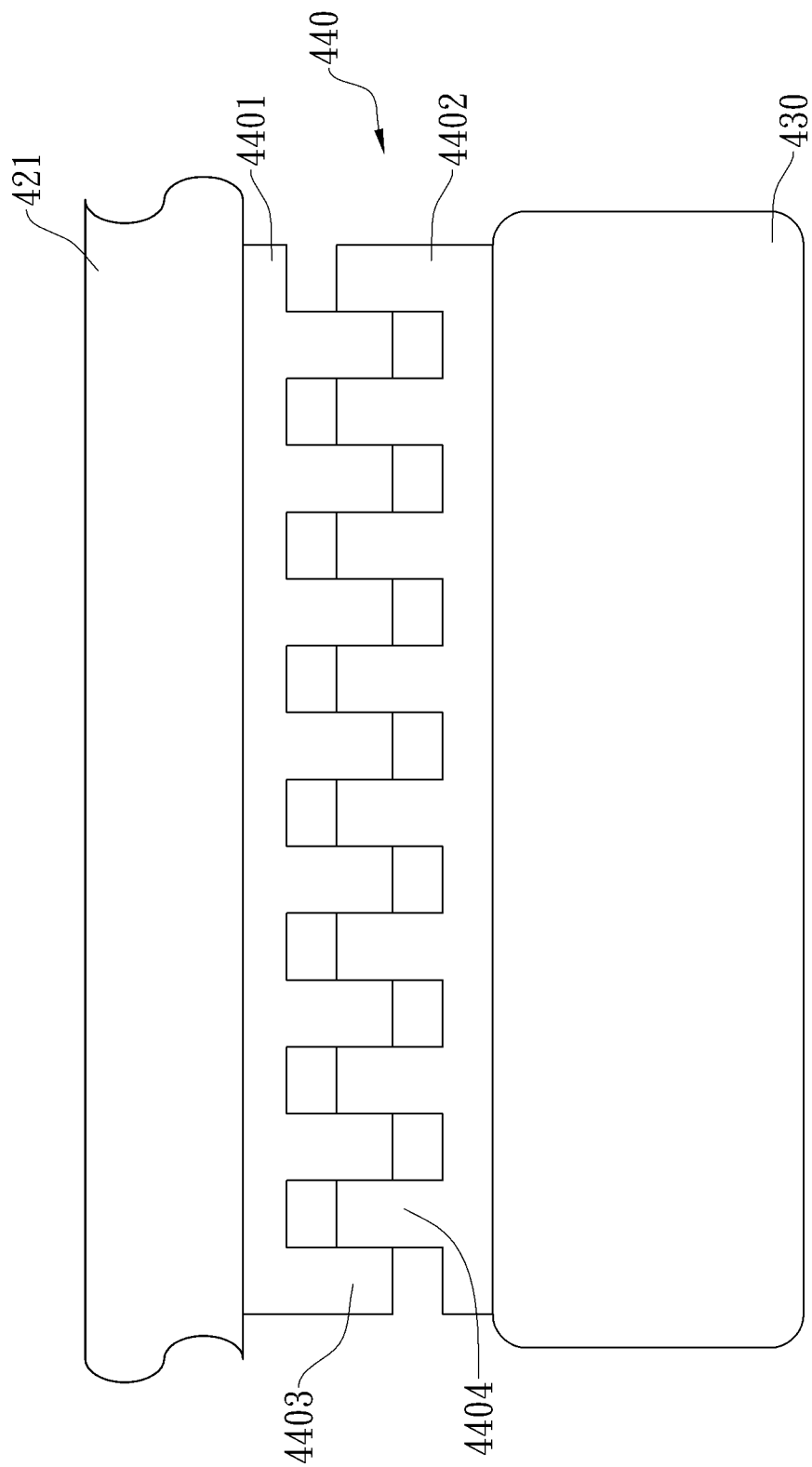
FIG. 4A is an enlarged view illustrating the modular electronic equipment, the first detachable thermal interface in the locked state and the top wall of the electronic chassis in the second embodiment of the present invention.
Figure 4B:
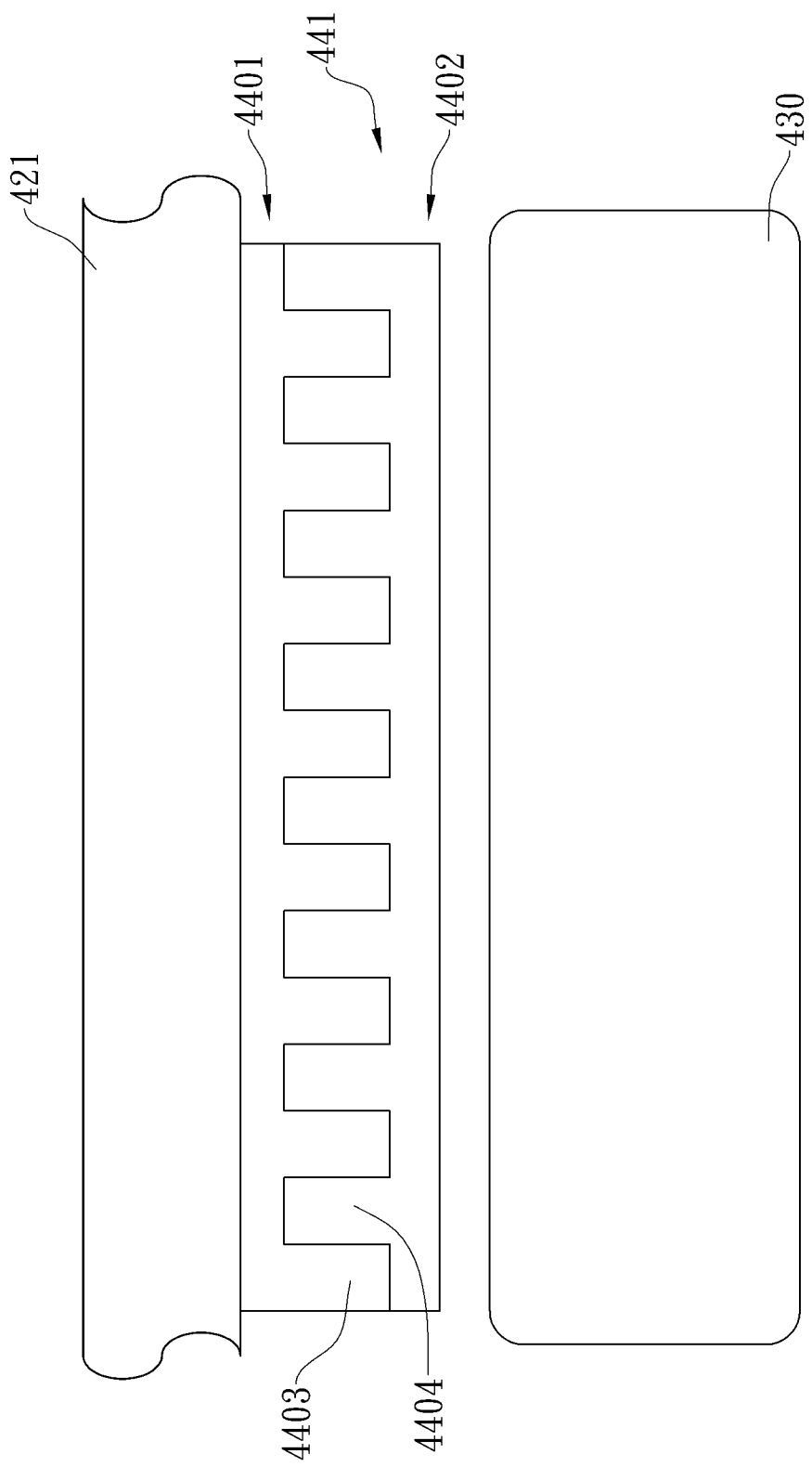
FIG. 4B is an enlarged view illustrating the modular electronic equipment, the first detachable thermal interface in the detached state and the top wall of the electronic chassis in the second embodiment of the present invention.

FIGS. 4A and 4B are enlarged views illustrating the modular electronic equipment 430, the first detachable thermal interface 440 and the top wall 421 of the electronic chassis 420 in accordance with the second embodiment of the present invention. Moreover, FIGS. 4A and 4B illustrate the first detachable thermal interface 440 in the locked state and the detached state, respectively. The first detachable thermal interface 440 comprises a first plate 4401 with a first fin 4403 and a second plate 4402 with a second fin 4404. The first plate 4401 is fixed solidly on the top wall 421 of the electronic chassis 420 and the second plate 4402 is movably disposed between the first plate 4401 and the modular electronic equipment 430. FIG. 4A is a diagram illustrating the first detachable thermal interface 440 in the locked state. The second plate 4402 is disposed on the modular electronic equipment 430 and the second fin 4404 engages to the first fin 4403 to form a contact between the first plate 4401 and the second plate 4402. Consequently, the first detachable thermal interface 440 is in close contact with the top wall 421 of the electronics chassis 420 and the modular electronic equipment 430. FIG. 4B is a diagram illustrating the first detachable thermal interface 440 in the detached state. The second plate 4402 is moved toward the first plate 4401 and thus a gap is formed between the second plate 4402 and the modular electronic equipment 430. As a result, the modular electronic equipment 430 can be easily extracted and removed in the detached state. Preferably, thermal filler can also be used between the second plate 4402 and the modular electronic equipment 430 or between the first plate 4401 and the second plate 4402. Additionally, the rest components and connection in the second embodiment of the present invention are similar to those described in the first embodiment of the present invention and thus not redundantly described herein.

Figure 5A:
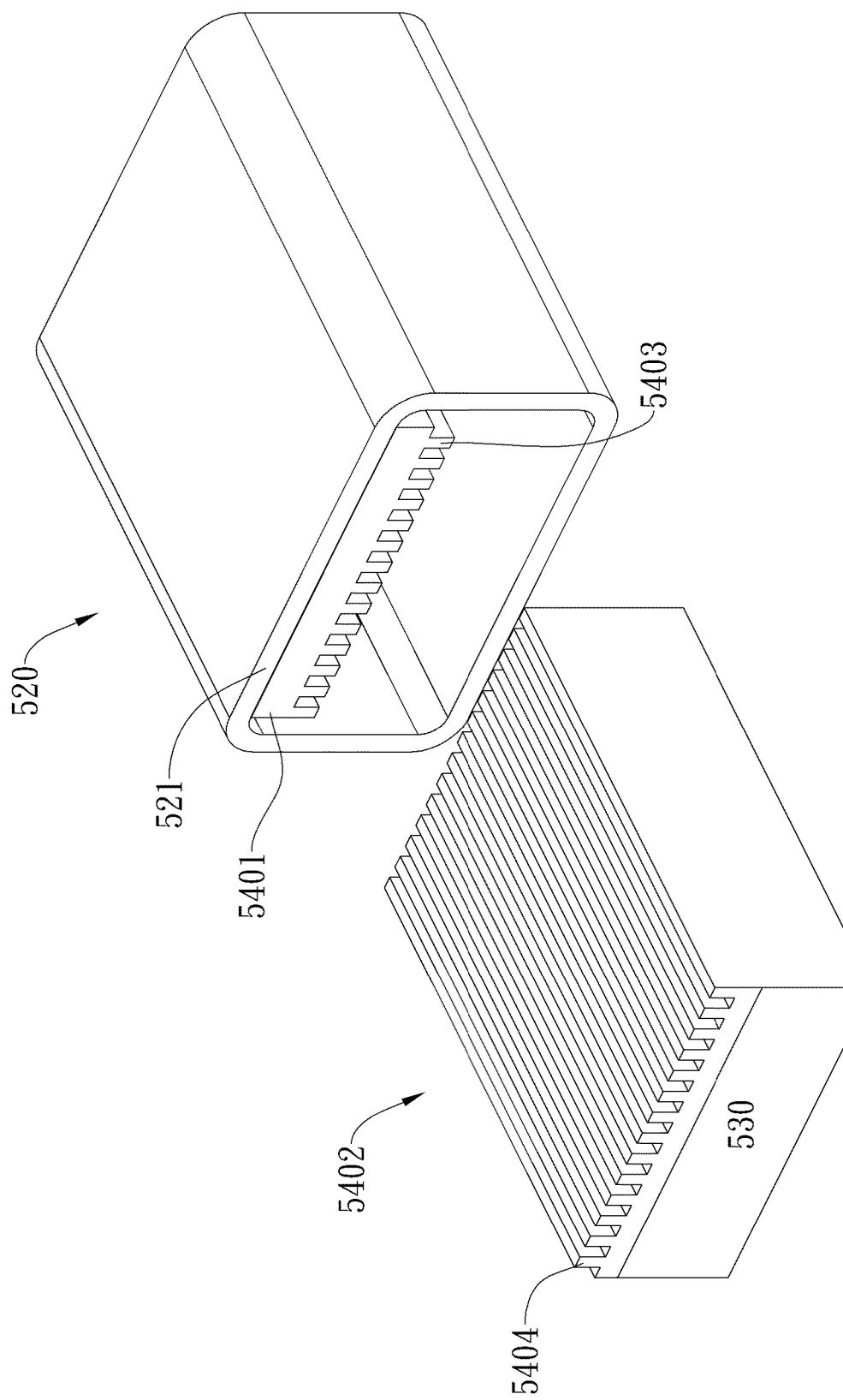
FIG. 5A is an enlarged view illustrating the modular electronic equipment and the first detachable thermal interface in the detached state before insertion into the electronic chassis in the third embodiment of the present invention.
Figure 5B:
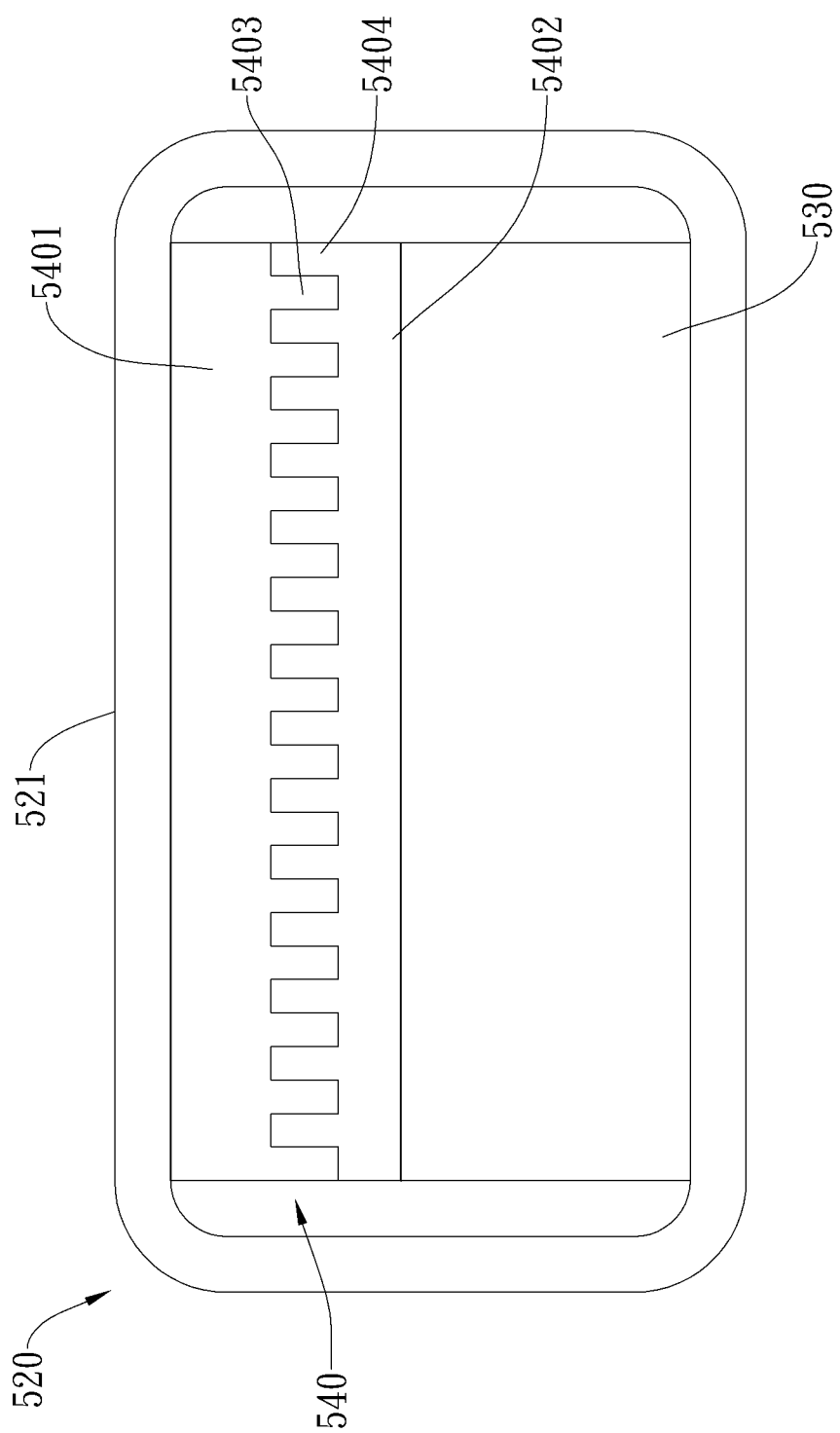
FIG. 5B is an enlarged view illustrating the modular electronic equipment and the first detachable thermal interface in the locked state after insertion into the electronic chassis in the third embodiment of the present invention.

FIGS. 5A and 5B illustrate the modular electronic equipment 530, the first detachable thermal interface 540 and the electronic chassis 520 in accordance with the third embodiment of the present invention. FIGS. 5A and 5B illustrate the first detachable thermal interface 540 in the detached state and the locked state, respectively. The first detachable thermal interface 540 comprises a first plate 5401 with a first fin 5403 and a second plate 5402 with a second fin 5404. FIG. 5A is a diagram illustrating the modular electronic equipment 530 in the detached state before insertion into the electronic chassis 520. The first plate 5401 is fixed solidly on the top wall 521 of the electronic chassis 520 and the second plate 5402 is fixed solidly on the modular electronic equipment 530. To position the second plate 5402 and the modular electronic equipment 530 in the locked stated, the second plate 5402 and the modular electronic equipment 530 are inserted into the electronic chassis 520 along the X direction. FIG. 5B is a diagram illustrating the modular electronic equipment 530 and the second plate 5402 in the locked state after insertion into the electronic chassis 520. The gap between the first fin 5403 and the second fin 5404 is less than few hundred micrometers. As a result, heat generated by the electronic components can be conducted from the modular electronic equipment 530 to the top wall 521 of the electronic chassis 520 along the Z direction. The modular electronic equipment 530 can be fixed in the locked state by various lock mechanisms and can be extracted easily when the lock mechanism is released. Preferably, thermal filler can be used to fill the gap between the first fin 5403 and the second fin 5404 to improve the thermal conductivity. Additionally, the rest components and connection in the third embodiment of the present invention are similar to those described in the first embodiment of the present invention and thus not redundantly described herein.

Figure 6:
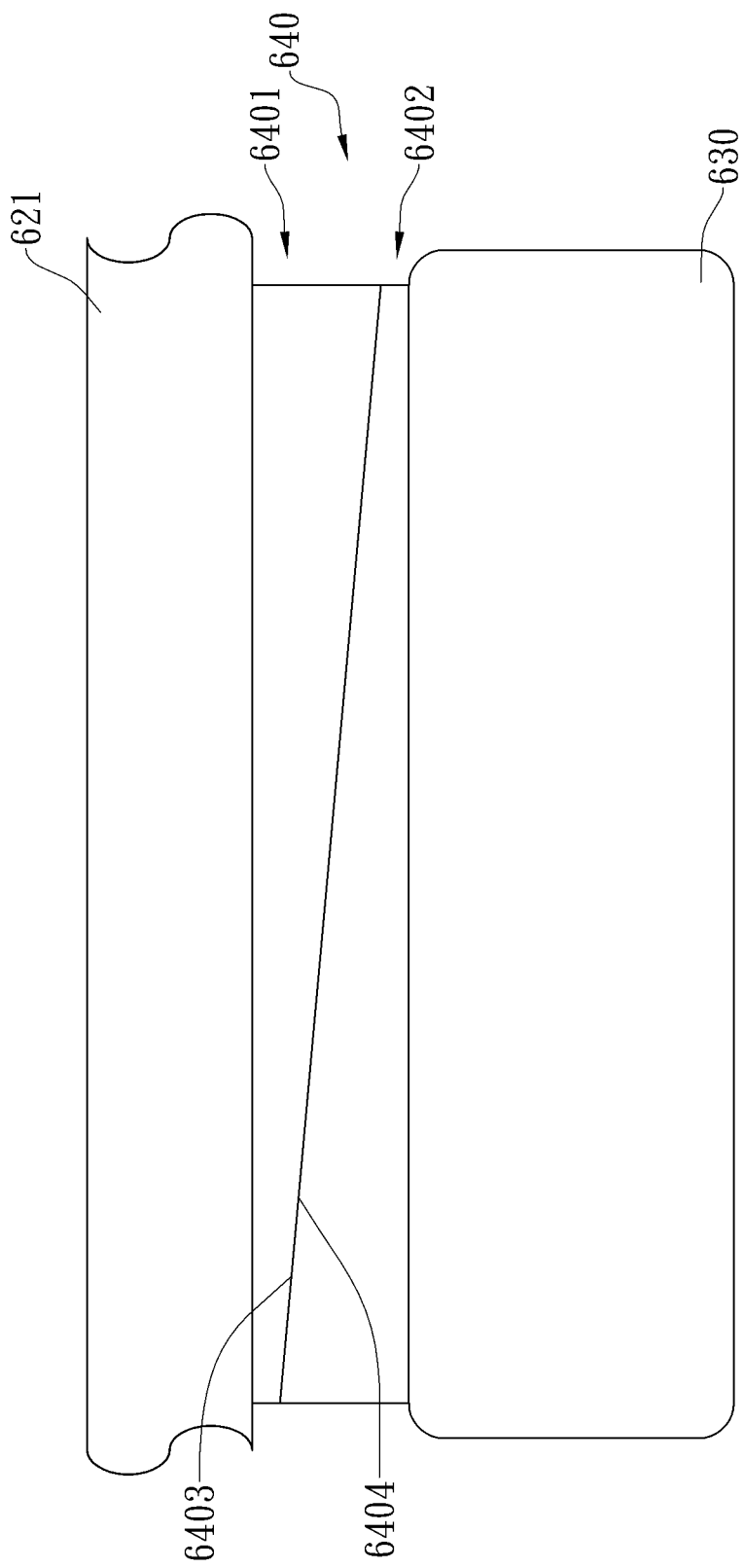
FIG. 6 is an enlarged view illustrating the modular electronic equipment, the first detachable thermal interface and the top wall of the electronic chassis in the fourth embodiment of the present invention.

FIG. 6 are enlarged views illustrating the modular electronic equipment 630, the first detachable thermal interface 640 and the top wall 621 of the electronic chassis in accordance with the fourth embodiment of the present invention. The first detachable thermal interface 640 comprises a first plate 6401 with a first oblique plane 6403 and a second plate 6402 with a second oblique plane 6404. The first plate 6401 is fixed solidly on the top wall 621 of the electronic chassis and the second plate 6402 is movably disposed between the first plate 6401 and the modular electronic equipment 630. In the locked state, the second plate 6402 is disposed on the modular electronic equipment 630 and the second oblique plane 6404 engages to the first oblique plane 6403 to form a contact between the first plate 6401 and the second plate 6402. Consequently, the first detachable thermal interface 640 is in close contact with the top wall 621 of the electronics chassis and the modular electronic equipment 630. On the other hand, in a detached state, the second plate 6402 and the modular electronic equipment 630 can be easily extracted and removed. Preferably, the second plate 6402 can be mounted on the modular electronic equipment 630. Additionally, the rest components and connection in the fourth embodiment of the present invention are similar to those described in the first embodiment of the present invention and thus not redundantly described herein.

Figure 7:
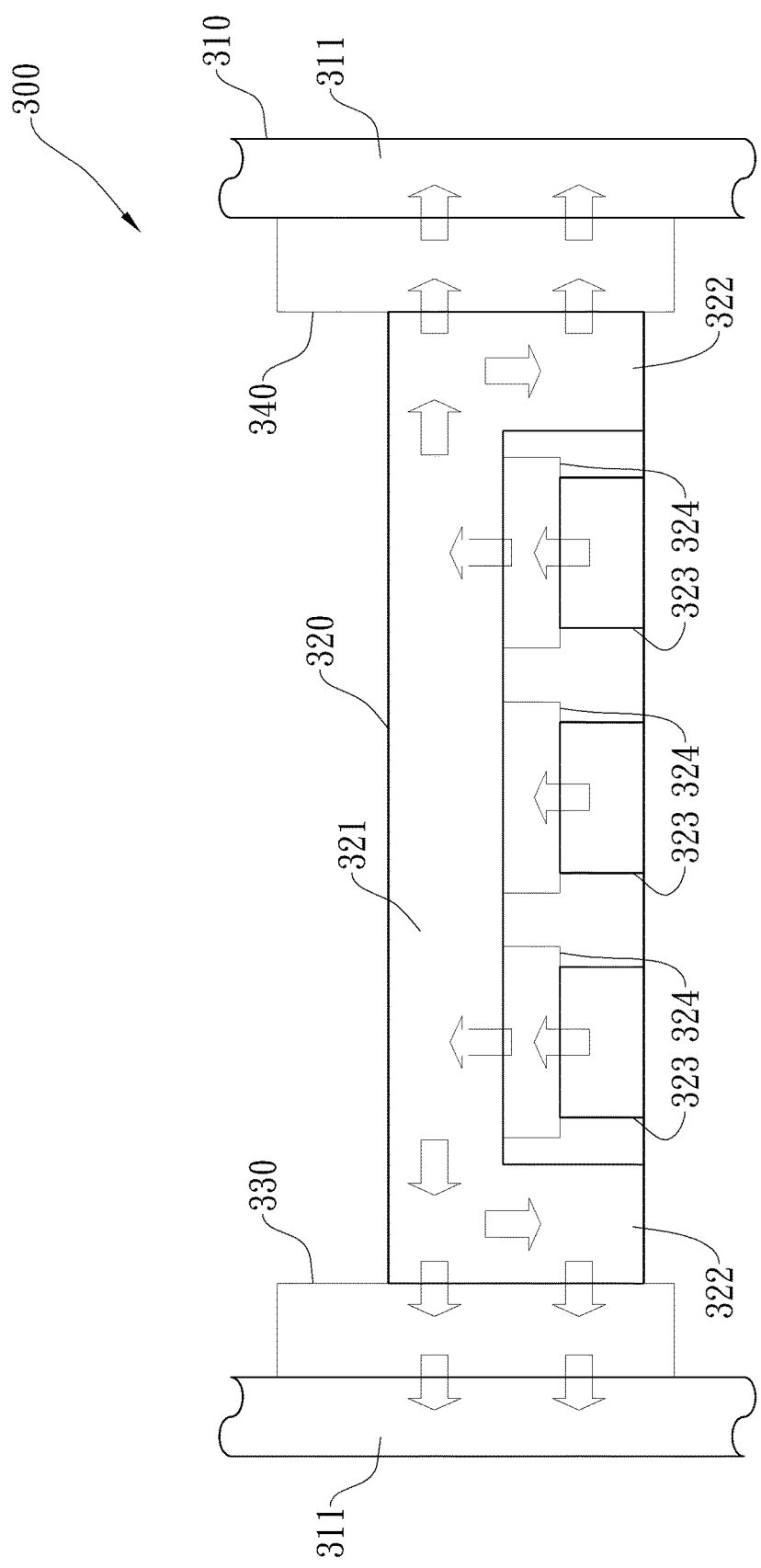
FIG. 7 is a partial view of a cooling system for an electronic rack in accordance with the fourth embodiment of the present invention.

FIG. 7 is a partial view of a cooling system for an electronic rack in accordance with the fifth embodiment of the present invention. The cooling system 300 for an electronic rack of the present invention comprises an electronic rack 310, a plurality of modular electronic equipment 320 and a plurality of detachable thermal interfaces 330. It should be noted that the cooling system 300 is similar to the cooling system 200 shown in FIG. 2, except that the cooling system 300 does not comprise a detachable thermal interface that is similar to the first detachable thermal interface 240 (as illustrated in FIG. 2). Moreover, as the plurality of modular electronic equipment 320 of the cooling system 300 for an electronic rack are connected to the electronic rack 310 in the same manner, FIG. 7 only illustrates one modular electronic equipment 320. The electronic rack 310 comprises two side walls 311, and the modular electronic equipment 320 comprises a top wall 321 and two side walls 322. The modular electronic equipment 320 comprises a plurality of electronic components 323 (e.g. IC, hard drive, etc.) and a plurality of stationary thermal interfaces 324 arranged between the upper portions of the plurality of electronic components 323 and the top wall 321 and is disposed inside the electronic rack 310. The plurality of detachable thermal interfaces 330 are arranged between the side walls 311 of the electronic rack 310 and the side walls 322 of the modular electronic equipment 320. The configuration of the detachable thermal interface 330 may have different embodiments as shown in FIGS. 2, 3, 4, 5 and 6. The arrows in FIG. 7 indicate the heat flows, i.e. the thermal paths, in the cooling system 300 for an electronic rack. Heat generated by the electronic components 323 (e.g. IC, hard disk, etc.) in the modular electronic equipment 320 is conducted to the top wall 321 and the two side walls 322 of the modular electronic equipment 320 via the plurality of stationary thermal interfaces 324. The two side walls 311 of the electronic rack 310 then conduct the heat generated by the electronic components 323 (e.g. IC, hard disk, etc.) to the external environment from the top wall 321 and the two side walls 322 of the modular electronic equipment 320 via the plurality of detachable thermal interfaces 330. The arrangement of thermal interfaces and large contact surfaces enables the cooling system 300 for an electronic rack to conduct and dissipate heat effectively without fans and air flows. In the fourth embodiment of the present invention, the detachable thermal interface 330 may be a plate made by material with high thermal conductivity, a heat pipe, or a metallic plate and the structural design thereof can be the same as that of the first detachable thermal interface 240, 440, or 540.

The spirit and scope of the present invention are not limited to the aforementioned embodiments. In addition, it will be understood that the drawings are merely schematic representations of the invention and not illustrated according to actual scale, and some of the components may have been magnified or simplified for purposes of pictorial clarity. The embodiments depicted above and the appended drawings are exemplary and are not intended to limit the scope of the present invention. The scope thereof is defined by the appended claims.

What is claimed is:

1. A cooling system for an electronic rack comprising:
   an electronic rack comprising at least one side wall;
   at least one electronic chassis comprising a top wall and at least one side wall and disposed inside the electronic rack for housing at least one modular electronic equipment comprising a plurality of electronic components and at least one stationary thermal interface arranged above the plurality of electronic components;
   a first detachable thermal interface arranged between the top wall of the electronic chassis and the at least one modular electronic equipment; and
   at least one second detachable thermal interface arranged between the at least one side wall of the electronic rack and the at least one side wall of the at least one electronic chassis,
   wherein the first detachable thermal interface comprises a first plate and a second plate to form a contact between each other,
   wherein the first plate comprises a first oblique surface and the second plate comprises a second oblique surface to form the contact between the first plate and the second plate.

2. The cooling system for an electronic rack according to claim 1, wherein the first detachable thermal interface or the at least one second detachable thermal interface is made of material with high thermal conductivity.

3. The cooling system for an electronic rack according to claim 1, wherein the first detachable thermal interface or the at least one second detachable thermal interface is made of metallic material.

4. The cooling system for an electronic rack according to claim 1, wherein the first detachable thermal interface or the at least one second detachable thermal interface is a heat pipe.

5. The cooling system for an electronic rack according to claim 1, wherein the electronic rack is provided with no fans therein.

6. The cooling system for an electronic rack according to claim 1, wherein the first plate is fixed solidly on the top wall of the electronic chassis.

7. A cooling system for an electronic rack comprising:
   an electronic rack comprising at least one side wall;
   at least one modular electronic equipment comprising a top wall, at least one side wall, a plurality of electronic components and at least one stationary thermal interface arranged between the upper portions of the plurality of electronic components and the top wall and disposed inside the electronics rack; and
   at least one detachable thermal interface arranged between the at least one side wall of the electronic rack and the at least one side wall of the at least one modular electronic equipment,
   wherein the at least one detachable thermal interface comprises a first plate and a second plate to form a contact between each other,
   wherein the first plate comprises a first oblique surface and the second plate comprises a second oblique surface to form the contact between the first plate and the second plate.

8. The cooling system for an electronic rack according to claim 7, wherein the at least one detachable interface is made of metallic material.

9. The cooling system for an electronic rack according to claim 7, wherein the at least one detachable thermal interface is a heat pipe.

10. The cooling system for an electronic rack according to claim 7, wherein the electronic rack is provided with no fans therein.

11. The cooling system for an electronic rack according to claim 7, the first plate is fixed solidly on the at least one side wall of the electronic rack.

12. The cooling system for an electronics rack according to claim 7, wherein the at least one detachable thermal interface is made of material with high thermal conductivity.

* * * * *